United States Patent
Verhaeghe et al.

[11] Patent Number: 5,804,996
[45] Date of Patent: Sep. 8, 1998

[54] LOW-POWER NON-RESETABLE TEST MODE CIRCUIT

[75] Inventors: Donald J. Verhaeghe; William F. Kraus, both of Colorado Springs, Colo.; Yoshihiko Yasu, Koganei, Japan

[73] Assignees: Ramtron International Corporation, Colorado Springs, Colo.; Hitachi, Ltd., Tokyo, Japan

[21] Appl. No.: 799,999

[22] Filed: Feb. 13, 1997

[51] Int. Cl.$^6$ ........................................... G01R 31/28
[52] U.S. Cl. .......................... 327/77; 327/81; 327/143; 324/158.1
[58] Field of Search .................. 327/77–81, 85, 327/88, 72, 74–76, 142, 143, 198; 371/22.1; 365/201; 324/158.1, 763, 765

[56] References Cited

U.S. PATENT DOCUMENTS

| | | | |
|---|---|---|---|
| 5,111,136 | 5/1992 | Kawashima | 327/77 |
| 5,402,063 | 3/1995 | Kim | 327/77 |
| 5,675,272 | 10/1997 | Chu | 327/77 |
| 5,712,575 | 1/1998 | Ma et al. | 324/763 |

*Primary Examiner*—Toan Tran
*Assistant Examiner*—T. T. Lam
*Attorney, Agent, or Firm*—Peter J. Meza, Esq.

[57] ABSTRACT

A test mode circuit for an integrated circuit includes a high voltage detector having an input for receiving a high voltage signal, a Schmitt trigger having an input coupled to the output of the high voltage detector, a latch having an input coupled to the output of the Schmitt trigger and an output for providing a test mode signal in a test operational mode, and additional control circuitry for disabling the high voltage detector and Schmitt trigger so that substantially all of the active current flow in the high voltage detector and Schmitt trigger is eliminated in a normal operational mode. The test mode circuit further includes circuitry for preventing a reset condition in the latch during the test mode until a power-down condition occurs. A glitch filter is also included, which is interposed between the output of the Schmitt trigger and the input to the latch. An integrated circuit pin is coupled to both the test mode circuit and to other circuitry on the integrated circuit not forming part of the test mode circuit.

19 Claims, 13 Drawing Sheets

LOW-POWER NON-RESETABLE TEST MODE CIRCUIT

BACKGROUND OF THE INVENTION

This invention relates generally to test mode circuits for an integrated circuit. More particularly, the present invention relates to a test mode circuit having a power saving feature, and that cannot be reset until the integrated circuit is powered down.

Referring now to FIG. 1, a prior art integrated circuit 10, such as a memory circuit, microprocessor, or the like, is shown having a main circuit 18 and a test mode circuit 16. The main circuit 18, for purposes of FIG. 1, is a circuit that includes the normal functional circuitry of integrated circuit 10. Main circuit 18 also includes external nodes or pins 14 not associated with the test mode circuit 16, which are inputs, outputs, or bi-directional pins. Typically, the test mode circuit 16 and main circuit 18 share a common external node 12. Node 12, under normal low voltage conditions, is typically an input or bi-directional pin for the main circuit 18. If a test mode is desired, a high voltage signal is applied to the test mode circuit 16 at node 12. The high voltage pulse is detected by test mode circuit 16, and a test mode signal is provided on node 20. Other techniques beyond the high voltage pulse are known for entering the test mode, such as placing a special code on node 12. The test mode signal changes the operation of main circuit 18 from a normal operating mode to a test mode. In the test mode, the characteristics of main circuit 18 or the input and output nodes 14 are changed as desired to affect the testing protocol.

There are several problems with the prior art test mode circuit 16 shown in FIG. 1. A first problem is that test mode circuit 16 draws current and therefore consumes power while integrated circuit 10 is in the normal or test operating modes. The extra power consumed by test mode circuit 16 can be significant, adding to the operating costs of integrated circuit 10. A further problem is the undesirable and accidental entering into the test mode during the normal operating condition, which could have disastrous results.

What is desired, therefore, is a test mode circuit resident on an integrated circuit that can draw little or no standby current during the normal operating mode of the integrated circuit, and that cannot be accidentally placed into the test mode.

SUMMARY OF THE INVENTION

It is, therefore, a principal object of the present invention to provide a robust test mode circuit for an integrated circuit such as a memory, microprocessor, or other integrated circuit.

It is an advantage of the test mode circuit of the present invention that overall integrated circuit power is reduced by disabling portions of the test mode circuit once normal operations have been initiated.

It is another advantage of the test mode circuit of the present invention that once the integrated circuit has been placed into the normal operating mode, the special test mode cannot be entered until the integrated circuit is completely powered down.

It is yet another advantage of the test mode circuit of the present invention that it can be easily adapted as desired to control various circuit blocks within the integrated circuit.

According to the present invention a test mode circuit for an integrated circuit includes a high voltage detector having an input for receiving a high voltage signal, a Schmitt trigger having an input coupled to the output of the high voltage detector, a latch having an input coupled to the output of the Schmitt trigger and an output for providing a test mode signal in a test operational mode, and additional control circuitry for disabling the high voltage detector and Schmitt trigger so that substantially all of the active current flow in the high voltage detector and Schmitt trigger is eliminated in a normal operational mode. The test mode circuit further includes circuitry for preventing a reset condition in the latch during the test mode until a power-down condition occurs. A glitch filter is also included, which is interposed between the output of the Schmitt trigger and the input to the latch. An integrated circuit pin is coupled to both the test mode circuit and to other circuitry on the integrated circuit not forming part of the test mode circuit.

The foregoing and other objects, features and advantages of the invention will become more readily apparent from the following detailed description of a preferred embodiment of the invention which proceeds with reference to the accompanying drawings.

DETAILED DESCRIPTION

Figure 1:
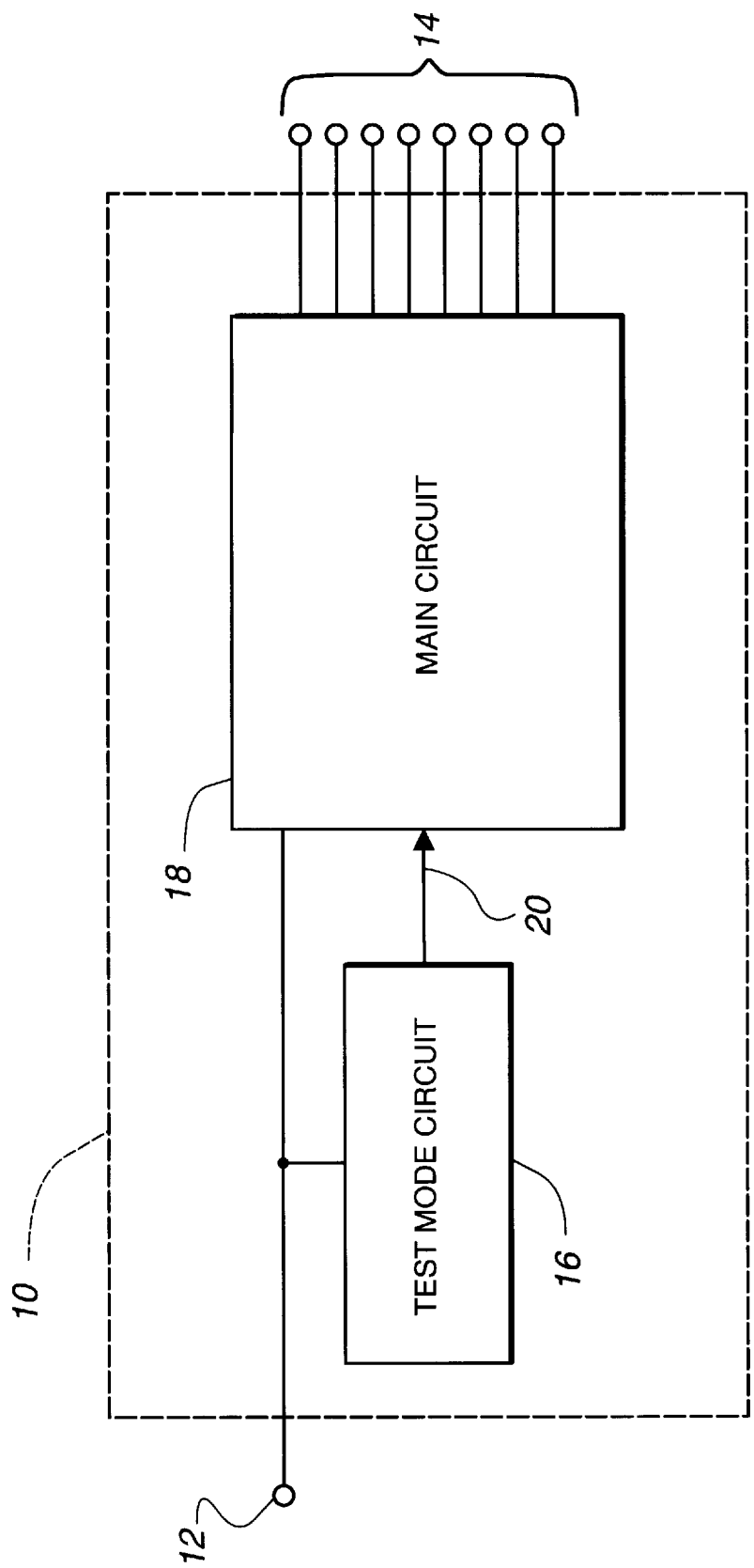
FIG. 1 is a block diagram of a prior art integrated circuit including, a main circuit in communication with a test mode circuit.
Figure 2:
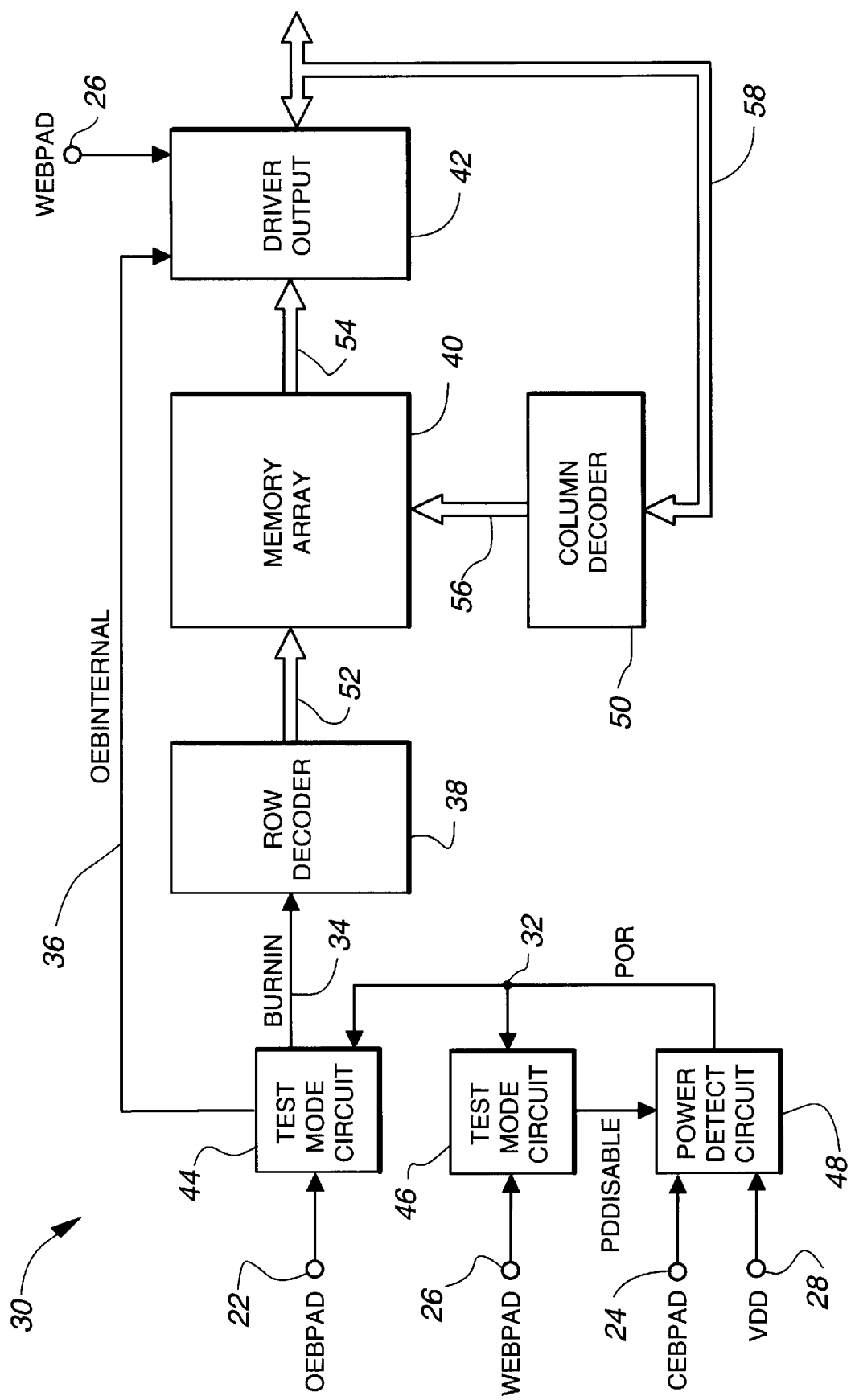
FIG. 2 is a block diagram of a portion of an integrated circuit memory including a first test mode circuit and a second test mode circuit according to the present invention.
Figure 3:
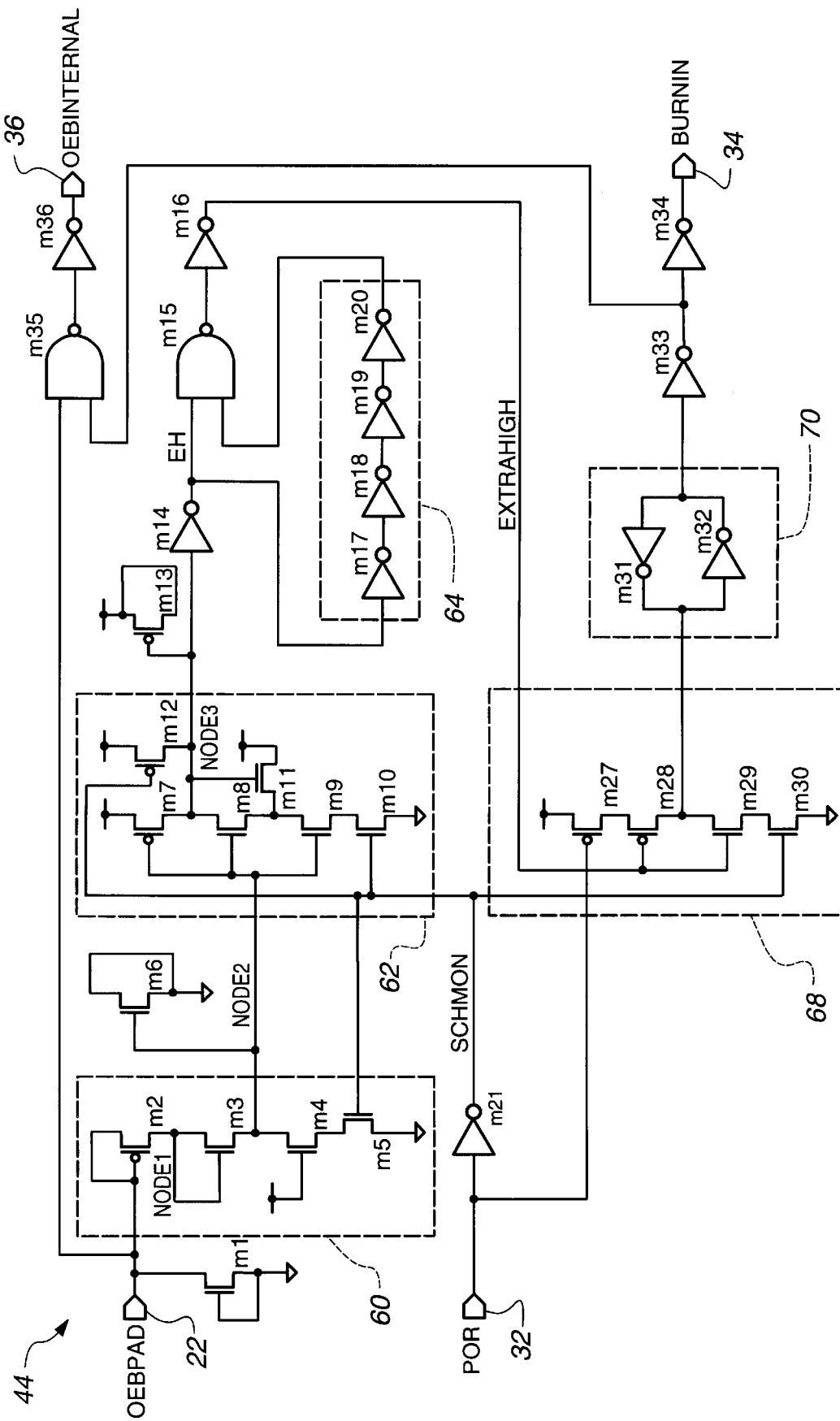
FIG. 3 is a schematic diagram of the first test mode circuit according to the present invention.
Figure 4:
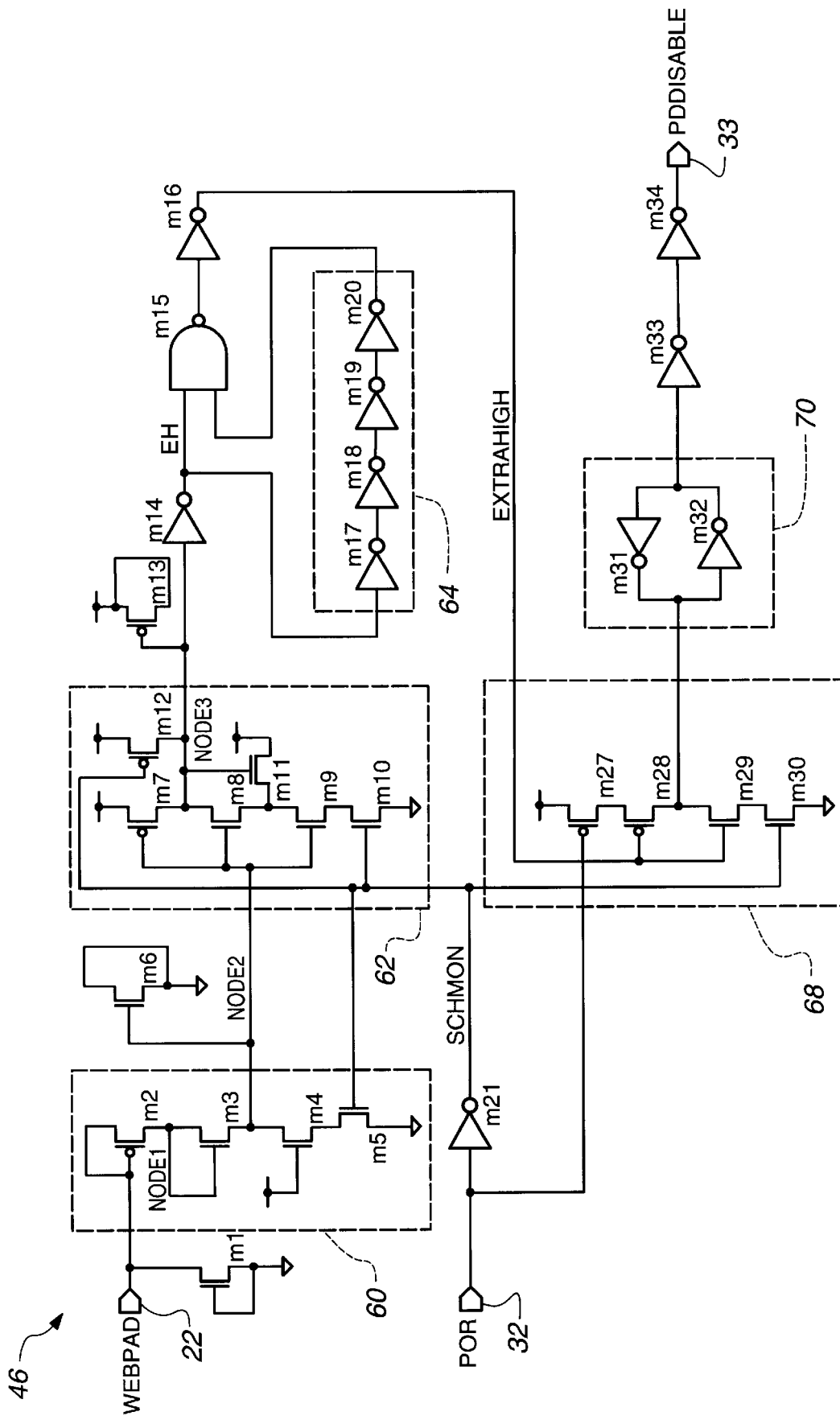
FIG. 4 is a schematic diagram of the second test mode circuit according to the present invention.

Referring now to FIG. 2, a block diagram of a portion of an integrated circuit memory 30 includes a first test mode circuit 44 and a second test mode circuit 46 according to the present invention. The transistor-level schematic for the first test mode circuit 44 is shown in FIG. 3, and the transistor-level schematic for the second test mode circuit 46 is shown in FIG. 4. The core design for each test circuit 44 and 46 is the same. Each test circuit, however, has been adapted to control separate circuit blocks within the integrated circuit memory 30, as is explained in further detail below. Referring again to FIG. 2, test mode circuit 44 has a first input on node 22 for receiving the OEBPAD signal. The OEBPAD signal is a typical integrated circuit memory signal that is shared with other memory circuitry (not shown in FIG. 2). Node 22 is actually an integrated circuit pin or "pad", which makes electrical connection to a circuit board, connector, or the like. During normal operation, the OEBPAD signal performs normal control functions for integrated circuit memory 30. During the special test mode, the OEBPAD signal is raised to an "extra-high" voltage level such as three volts above the nominal VDD level of five or 3.3 volts. The detailed operation of the OEBPAD signal levels and the interaction with test mode circuits 44 and 46 is explained in further detail below, especially with reference to the description associated with FIGS. 3 and 4. Test mode circuit 44 includes a further input on node 32 for receiving the POR signal, which is a function of the CEBPAD signal and related to the magnitude of the VDD power supply voltage. Test mode circuit 44 includes a first output for generating an OEBINTERNAL signal on node 36 for controlling the output impedance of output driver 42, and a second output for generating a BURNIN signal on node 34 for controlling the voltage boost characteristics of row decoder 38.

Referring again to FIG. 2, test mode circuit 46 has a first input on node 26 for receiving the WEBPAD signal. The WEBPAD signal is also a typical integrated circuit memory signal that is shared with other memory circuitry (not shown in FIG. 2). Node 26 is also an integrated circuit pin or "pad", which makes electrical connection to a circuit board, connector, or the like. During normal operation, the WEBPAD signal performs normal control functions for integrated circuit memory 30. During the special test mode, the WEBPAD signal is raised to the extra-high voltage level of three volts above the nominal VDD level of five or 3.3 volts. Test mode circuit 46 includes a further input on node 32 for receiving the POR signal, which is a function of the CEBPAD signal and related to the magnitude of the VDD power supply voltage. Test mode circuit 46 includes an output for generating a PDDISABLE signal on node 33 for disabling the power detect circuit 48.

Also shown in FIG. 2 is a memory array 40, which can be an array of ferroelectric, DRAM, or any other type of memory cells. Array 40 receives row addresses from row decoder 38 through data bus 52. Column decoder 50 generates column addresses, which are input to array 40 through data bus 56. Column decoder 50 receives external data, or data from output driver 42 though data bus 58. Also note in FIG. 2 that output driver 42 includes a second input for receiving the WEBPAD signal on node 26, and that power detect circuit 48 includes an input for receiving the VDD power supply voltage, both of which circuits will be explained in further detail below.

Referring now to the detailed schematic of FIG. 3, test mode circuit 44 includes a high voltage detector 60 having an input for receiving the OEBPAD signal on node 22 and an output designated NODE2. The input to the high voltage detector 60 is an integrated circuit pin coupled to both the test mode circuit 44 and to other circuitry not forming part of the test mode circuit. A modified Schmitt trigger 62 has an input coupled to the output of the high voltage detector 60 at NODE2 and an output designated NODE3. A latch 68, 70 has an input stage 68 and a latch stage 70. The input stage 68 is used to prevent a reset condition in latch stage 70 during the test mode until a power-down condition occurs. An input of the input stage 68 is designated SCHMON, which is also coupled to an input of the modified Schmitt trigger 62. The output of input stage 68 is coupled to the input of the latch stage 70. The output of latch stage 70 is coupled through inverters m33 and m34 for providing the BURNIN test mode signal in a test operational mode at node 34. An inverter m21 generates the SCHMON signal, which is used to disable the high voltage detector 60 and Schmitt trigger 62 such that substantially all of the active current flow in those circuit blocks is eliminated in a normal operational mode. Inverter m21 receives the POR control signal on node 32 from power detect circuit 48. In FIG. 3, a glitch filter consisting of inverter string 64, logic gate m15, and inverter m16 is interposed between the output of the modified Schmitt trigger 62 and the input to input stage 68, which is used filter extraneous pulses and glitches in order to prevent a false entry into the test mode.

The high voltage detector 60 includes a first diode-connected N-channel transistor m2 having an anode forming the input at node 22. A second diode-connected transistor m3 has an anode coupled to the cathode of the first diode-connected transistor m2 at NODE1. A first N-channel transistor m4 has a drain coupled to the output of the high voltage detector 60 at NODE2 and a gate coupled to the VDD power supply voltage source. A second N-channel transistor m5 has a drain coupled to the source of the first transistor m4, a gate for receiving the SCHMON signal from inverter m21, and a source coupled to ground. Diode-connected transistor m1 has a cathode coupled to the input node 22 of the high voltage detector 60 and an anode coupled to ground. The reversed-biased junction of diode-connected transistor m1 is used for ESD (electrostatic discharge) protection. A capacitor-connected N-channel transistor m6 is coupled between the output of high voltage detector 60 at NODE2 and ground to force an initial logic low condition on NODE2.

In operation, high voltage detector 60 is used to generate a logic high voltage at NODE2 when the OEBPAD signal reaches a voltage of about VDD plus three volts, and when the SCHMON signal is a logic high voltage. The "extra-high" VDD+3 volt signal is transformed into a standard logic high voltage since the voltage drop across diode-connected transistors m2 and m3 totals about three volts. In addition, the SCHMON signal generated by inverter m21 must be at a logic high level so that current flows though diode-connected transistors m2 and m3.

Schmitt trigger circuit 62 is modified to have only one high trip point. The gate of N-channel transistor m10 receives the SCHMON signal, which is used to stop the active current flow and thus reduce power consumption once normal operation of the part is initiated. Modified Schmitt trigger 62 includes a P-channel transistor m7, and serially coupled N-channel transistors m8, m9, and m10. The gates of transistors m7, m8, and m9 are coupled together to form the input of modified Schmitt trigger circuit 62 at NODE2. N-channel transistor m11 is used to generate the feedback from the output of Schmitt trigger circuit 62 at NODE3 to the junction of transistors m8 and m9 to generate the modified high input threshold level, as well as to provide hysteresis. The gate of transistor m11 is therefore coupled to NODE3, a first source/drain of transistor m11 is coupled to the junction of transistors m8 and m9, and the other source/drain of transistor m11 is coupled to the VDD power supply voltage source. P-channel transistor m12, which is coupled between the VDD power supply and the output NODE3, is off when the SCHMON signal is high, and clamps NODE3 to VDD volts when the SCHMON signal is low. A capacitor-connected P-channel transistor m13 is coupled between the NODE3 output of the Schmitt trigger 62 and the VDD source of supply voltage. Transistor m13 is used to force an initial VDD volt condition on NODE3. Inverter m14 is coupled to NODE3 to provide the inverted EH signal.

In operation, modified Schmitt trigger circuit 62 has an input switching threshold of about 85% of the VDD power supply voltage for positive-going edges and an input switching threshold of about 67% of the VDD power supply voltage for negative-going edges. The power consumption of Schmitt trigger circuit 62 is greatly reduced, and the output clamped to VDD volts when the SCHMON signal is at a logic low level.

A glitch filter consisting of logic gate m15, inverter string 64, and inverter m16 is interposed between the output of the Schmitt trigger 62 and the input to the latch input stage 68. Logic gate m15 has a first input coupled to the output of the Schmitt trigger circuit 62 through inverter m14 at node EH. The output of logic gate m15 is coupled to the input of the latch input stage 68 through inverter m16. Inverter block 64 includes four inverters m17, m18, m19, and m20, which are serially coupled between the first input of logic gate m15 at node EH, and the second input of logic gate m15. Inverter block 64 is used to generate a delay, the duration of which is on the order of extraneous pulses and glitches that are desired to be filtered out.

In operation, the glitch filter consisting of m15, m16, and inverter string 64 is used to filter out pulses that could accidentally and undesirably place test circuit 44 into the test mode.

In operation, inverter m21 provides the SCHMON signal, which is used to control the power consumption of the high voltage detector circuit 60 and the Schmitt trigger circuit 62. In addition, the POR signal is used to control the latch input stage 68, which in turn prevents the latch stage 70 from changing state during normal operating conditions.

Latch 68, 70 includes an input stage 68 and a latch stage 70. The input stage 68 includes cascoded P-channel transistors m27 and m28, and N-channel transistors m29 and m30. The gates of transistors m28 and m29 are coupled together to form an input of input stage 68. The input receives the EXTRAHIGH signal generated directly by the output of inverter m16. The gate of transistor m30 receives the SCHMON signal and the gate of transistor m27 receives the POR signal. The SCHMON signal is generated by inverter m21 and the POR signal is generated directly by power detect circuit 48. The junction of the source/drains of transistors m28 and m29 form the output of input stage 68. A latch stage 70 is formed by the cross-coupling of two inverters, m31 and m32. The input of latch stage 70 is coupled to the output of input stage 68. The output of latch stage 70 generates the BURNIN output signal at node 34, after passing through serially connected inverters m33 and m34. If desired, diode-connected transistors can be used at the input and output of latch 70 for setting the initial conditions at the input and output of the latch.

In operation, latch stage 70 is prevented from changing state by the operation of the SCHMON and POR signals, which is used to prevent further switching in the input stage 68. This, in turn, preserves the current logic state in latch stage 70. Latch 68, 70 cannot be reset until the integrated circuit is powered down, and initial operating conditions are restored.

The OEBINTERNAL signal at node 36, which is used to control the output driver circuit 42, as is explained in further detail below, is generated as the logical combination of the OEBPAD signal at node 22, and the signal at the output of inverter m33. Each of these signals is combined in NAND gate m35 and inverted by inverter m36 to generate the OEBINTERNAL signal at node 36.

Referring now to FIG. 4, test mode circuit 46 is identical in its core structure to test mode circuit 44 shown in FIG. 3, except that it has been slightly modified to use the output signal for a different purpose and application in the integrated circuit. Note that test mode circuit 46 does not include an output for generating the OEBINTERNAL signal, and therefore logic gate 35 and inverter m36 are omitted. Additionally, the BURNIN signal has been replaced by a PDDISABLE signal at node 33, which is used to control the power dissipation of the power detect circuit 48 seen in FIG. 2. Finally, the input to test mode circuit 46 is the WEBPAD signal, which is received on node 26 instead of the OEBPAD signal received at node 22 in test mode circuit 44. The precise operation of test mode circuits 44 and 46 is explained below, particularly with reference to the timing diagrams of FIGS. 6–8 and FIGS. 10–11.

Test mode circuits 44 and 46, therefore, are used to detect an extra-high voltage level on a particular input pin of an integrated circuit. An extra-high level is defined to be a voltage significantly higher than the operating VDD voltage, for example three volts higher. High voltage detector 60 detects the extra-high level by employing two diodes in series which feed a modified Schmitt trigger inverter circuit 62. Once the input pin 22 or 26 rises about two diode drop voltages above VDD, the Schmitt trigger circuit 62 switches, causing the EH signal to go high. The EH signal feeds a latch 68, 70, which is power-gated with the POR control signal via inverter m21. As long as the integrated circuit has not been accessed POR will remain low and the state of the EXTRA-HIGH signal will determine the logic state of the latch 68, 70. When the EH signal goes high, it will set latch 68, 70 and cause either the BURNIN signal (test mode circuit 44) or the PDDISABLE signal (test mode circuit 46) to go high. These signals are the ones that control the particular corresponding circuit block in the rest of the integrated circuit during the special test mode.

Inverter m21 driven by the POR signal is used to enable the modified Schmitt trigger circuit 62 only when the integrated circuit is first powered up.

Once POR goes high for the first access, the Schmitt trigger circuit 62 is disabled from reacting to any more inputs. This is achieved by turning off device m10, which cuts off the ground path for the modified Schmitt trigger circuit 62. To prevent any floating nodes from occurring, device m12 is turned on, causing NODE3 to be pulled up to the VDD voltage level for the duration of the power-up condition. Also note that device m5 is turned off at this point to decrease the current being drawn through the series devices m2, m3, and m4 in high voltage detector 60. By turning off the Schmitt trigger circuit 62 and the high voltage detector 60, all active current is eliminated in the entire test mode circuits 44 and 46; only leakage current will continue to flow. The POR signal is designed so that it will not activate during normal operation until VDD is detected to be very low. Devices m17, m18, m19, and m20 are used to filter out any short glitches that might possibly occur on the EH signal. Devices m6 and m13 at the input and output of the Schmitt trigger circuit 62 are used to help keep NODE2 at ground and NODE3 coupled to VDD during power up, which helps to keep the EH signal at ground. Finally, device m1, located at the input of high voltage detector 60, is used solely for the purpose of ESD input protection. The operation of test mode circuits is further described below with reference to the timing diagrams of FIGS. 5–8 and FIGS. 10–11.

Figure 5:
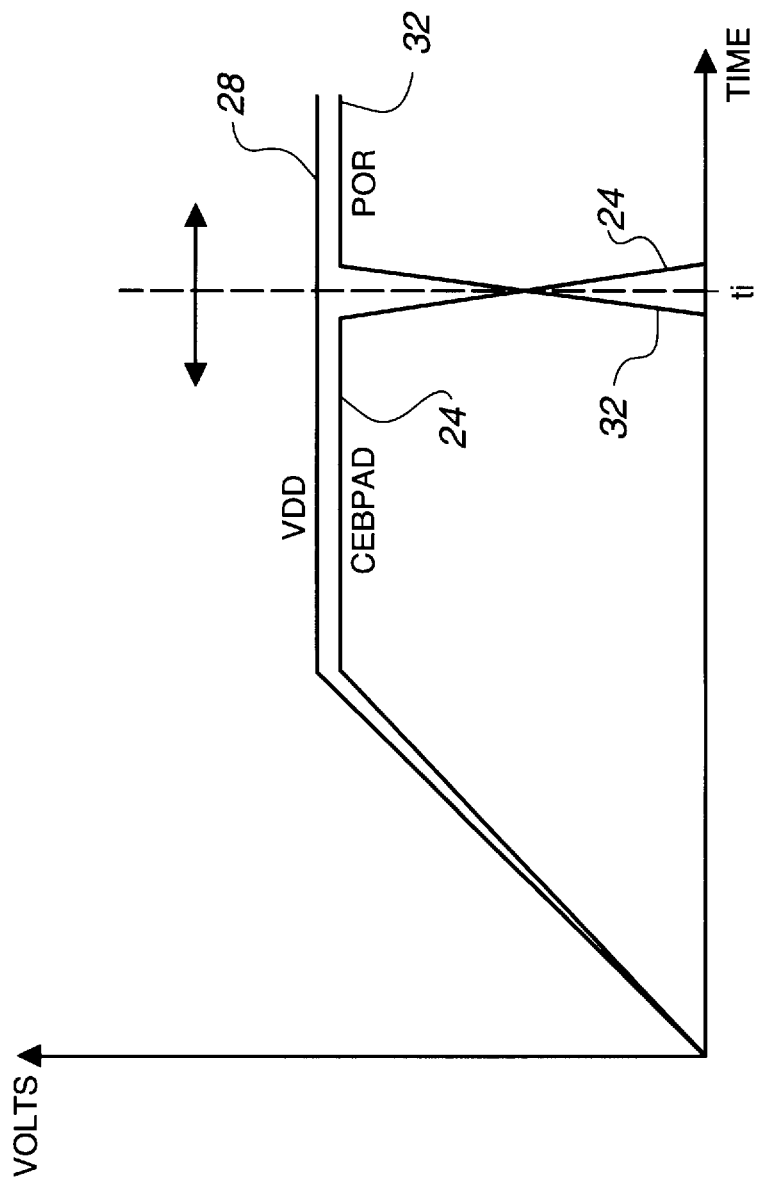
FIG. 5 is a timing diagram associated with both the first and second test mode circuits.
Figure 13:
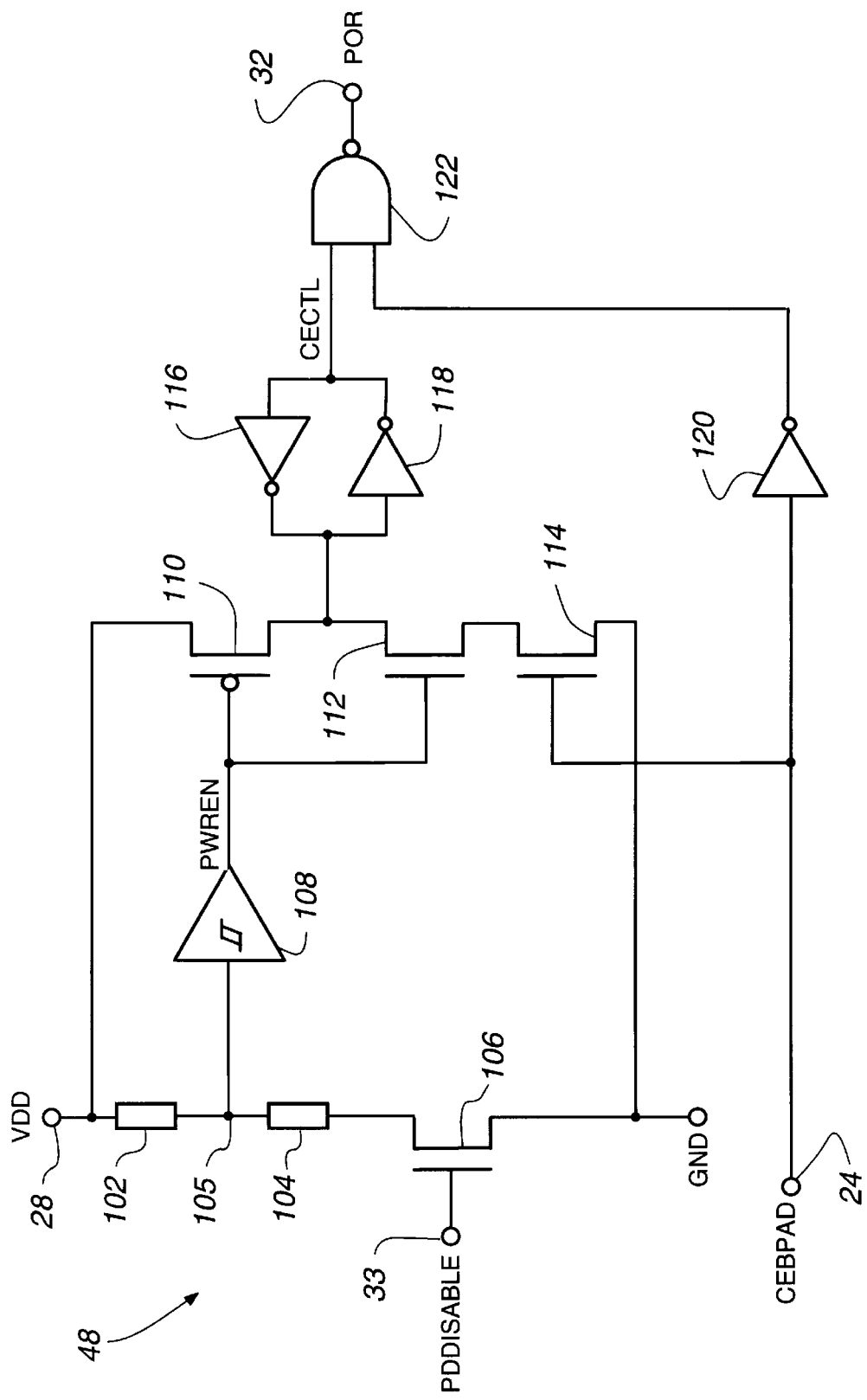
FIG. 13 is a schematic diagram of a power detect circuit shown in FIG. 2.

Referring now to FIG. 5, a timing diagram is shown that pertains both to test mode circuit 44 shown in FIG. 3 and test mode circuit 46 shown in FIG. 4. Three waveforms are shown; waveform 24 is the CEBPAD signal waveform, waveform 28 is the power supply VDD voltage waveform, and waveform 32 is the POR signal waveform. During the initial power-up phase prior to time t1, all waveforms have a zero voltage. Initially, the VDD and CEBPAD waveforms 28 and 24 increase until a final value is reached. The VDD and CEBPAD waveforms are shown distinctly in FIG. 5 for illustrative purposes, but are actually approximately the same voltage. The final value is equal to the power supply voltage of five volts, 3.3 volts, three volts, or the like. At time t1, the CEBPAD signal becomes active low, which accesses integrated memory circuit 30. Also at time t1, the POR signal is allowed to achieve an active high level. The POR signal indicates that the VDD voltage is at the proper operating level. While the proper VDD voltage may be attained prior to time t1, the POR signal is not allowed to go high until CEBPAD goes active low. The circuitry for achieving these logic signals is shown in FIG. 13.

It is important to note that prior to time t1, the special test mode may be entered if desired by the application of an extra-high voltage on the corresponding input pin 22 or 26 to test mode circuit 44 or 46, as described above. After time t1, when the POR signal waveform 32 has gone high, the special test mode cannot be accessed until a power-down condition has occurred.

Figure 6:
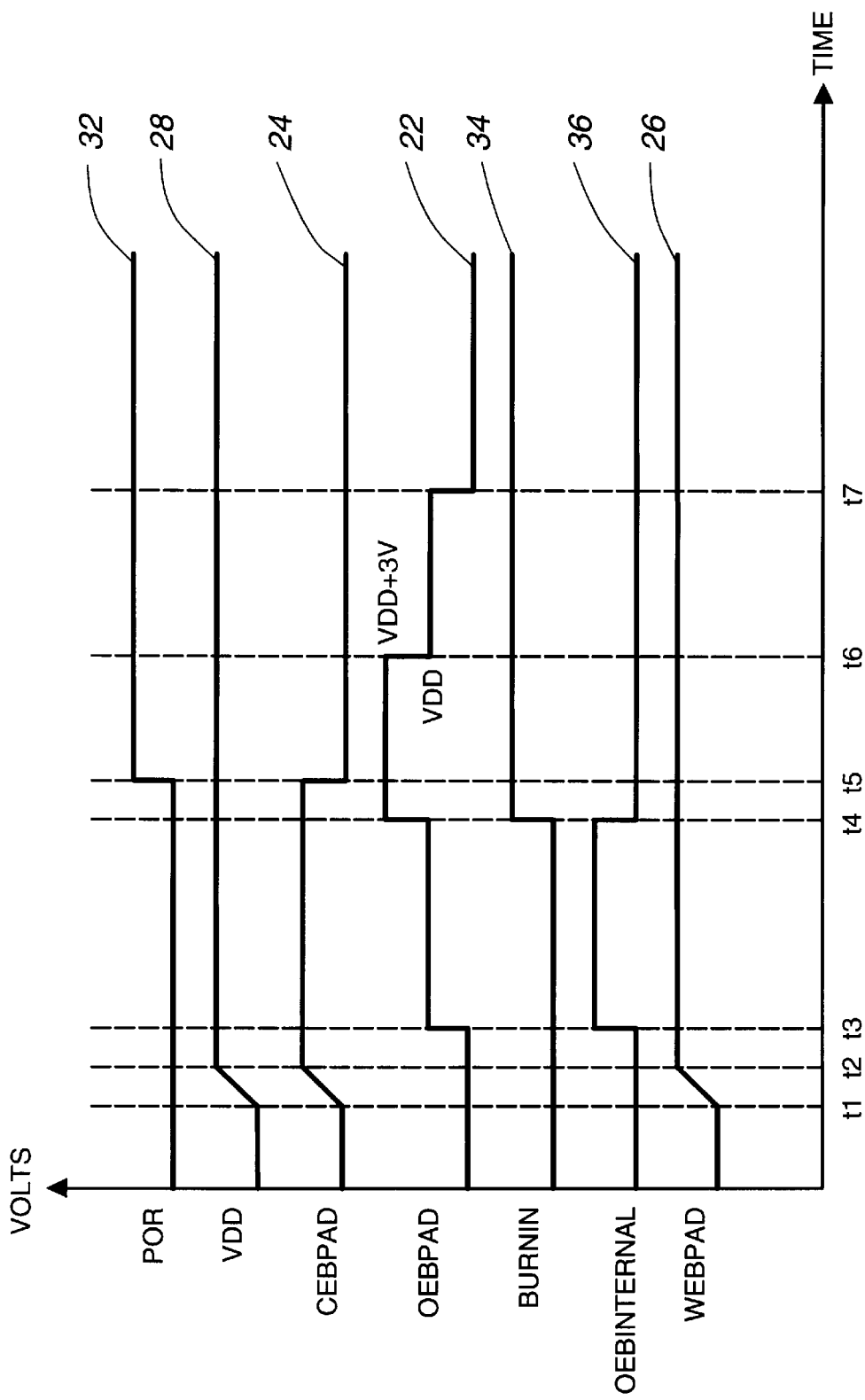
FIGS. 6–8 are timing diagrams associated with the first test mode circuit and the block diagram of FIG. 2.

Turning now to FIG. 6, a timing diagram pertaining to test mode circuit 44 is shown including the following voltage waveforms: the POR signal waveform 32; the VDD waveform 28; the CEBPAD waveform 24; the OEBPAD waveform 22; the BURNIN waveform 34; the OEBINTERNAL waveform 36; and the WEBPAD waveform 26. The timing diagram of FIG. 6 illustrates a proper entry into the special test mode, whereby the OEBPAD signal is taken to the extra-high voltage level before the CEBPAD signal goes active low.

At time t1 all signal waveforms are at ground potential. At time t2, the VDD, CEBPAD and WEBPAD signal waveforms have attained the full power supply voltage level. At time t3, the OEBPAD signal is energized, which causes the OEBINTERNAL signal to attain a logic high level. At time t4, the special test mode is entered by asserting the extra-high VDD+3 volts OEBPAD signal level, which in turn forces the BURNIN signal high. This in turn forces OEBINTERNAL to go low, independent of the state of OEBPAD. At time t5, the CEBPAD signal is taken low, which allows the POR signal to attain the full power supply voltage level. At time t6, the OEBPAD signal level is returned to the normal VDD power supply level, and at time t7, the OEBPAD signal level is returned to ground. Note that since BURNIN=1, OEBINTERNAL does not react to OEBPAD any longer.

It is important to note in FIG. 6 that once the special test mode has been entered into at time t4 the test mode is set, and cannot be reset until a power-down condition occurs. Thus, the status of the waveforms shown in FIG. 6, except for the status of the VDD waveform, has no effect on the logic level of the BURNIN signal waveform after time t6.

Figure 7:
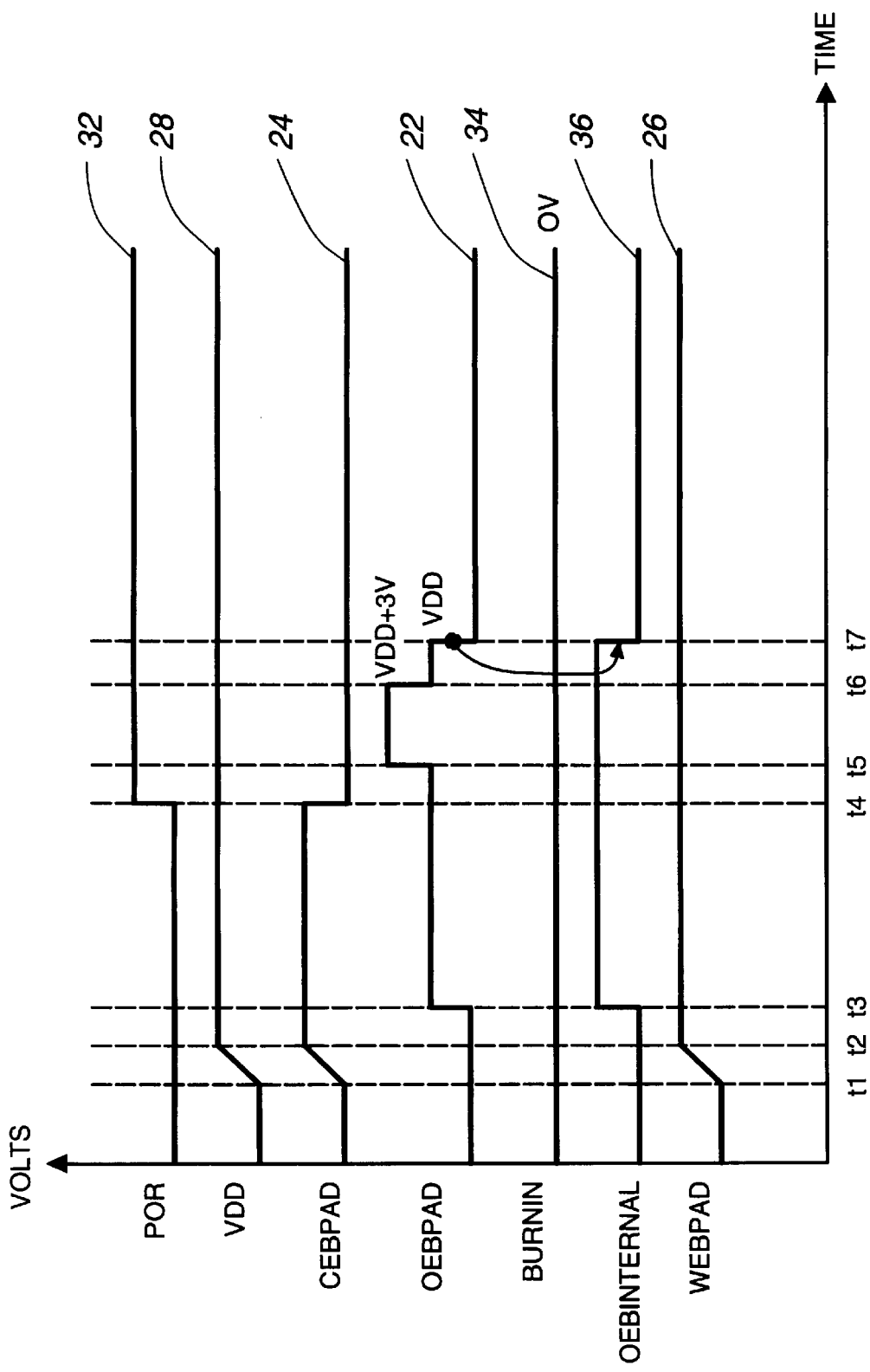

Turning now to FIG. 7, a timing diagram pertaining to test mode circuit 44 is shown that includes waveforms for the same signal nodes as in the timing diagram of FIG. 6. The timing diagram of FIG. 7, however, illustrates a failure to enter into the special test mode, because the OEBPAD signal is taken to the extra-high voltage level after the CEBPAD signal goes active low.

At time t1 all signal waveforms are at ground potential. At time t2, the VDD, CEBPAD and WEBPAD signal waveforms have attained the full power supply voltage level. At time t3, the OEBPAD signal is energized, which causes the OEBINTERNAL signal to attain a logic high level. At time t4, the CEBPAD signal is taken low, which allows the POR signal to attain the full power supply voltage level. At time t5, the special test mode is attempted to be entered into by asserting the extra-high VDD+3 volts OEBPAD signal level. The BURNIN signal however, remains low and the special test mode is not initiated. At time t6, the OEBPAD signal level is returned to the normal VDD power supply level, and at time t7, the OEBPAD signal level is returned to ground. Note that since BURNIN=0, OEBPAD still controls the logic level of OEBINTERNAL.

It is important to note in FIG. 7 that once the CEBPAD signal has been taken low, the special test mode cannot be entered until a power-down condition occurs. Thus, the status of any of the waveforms shown in FIG. 7, except for the VDD waveform, has any effect on the logic level of the BURNIN signal waveform after time t6.

Figure 9:
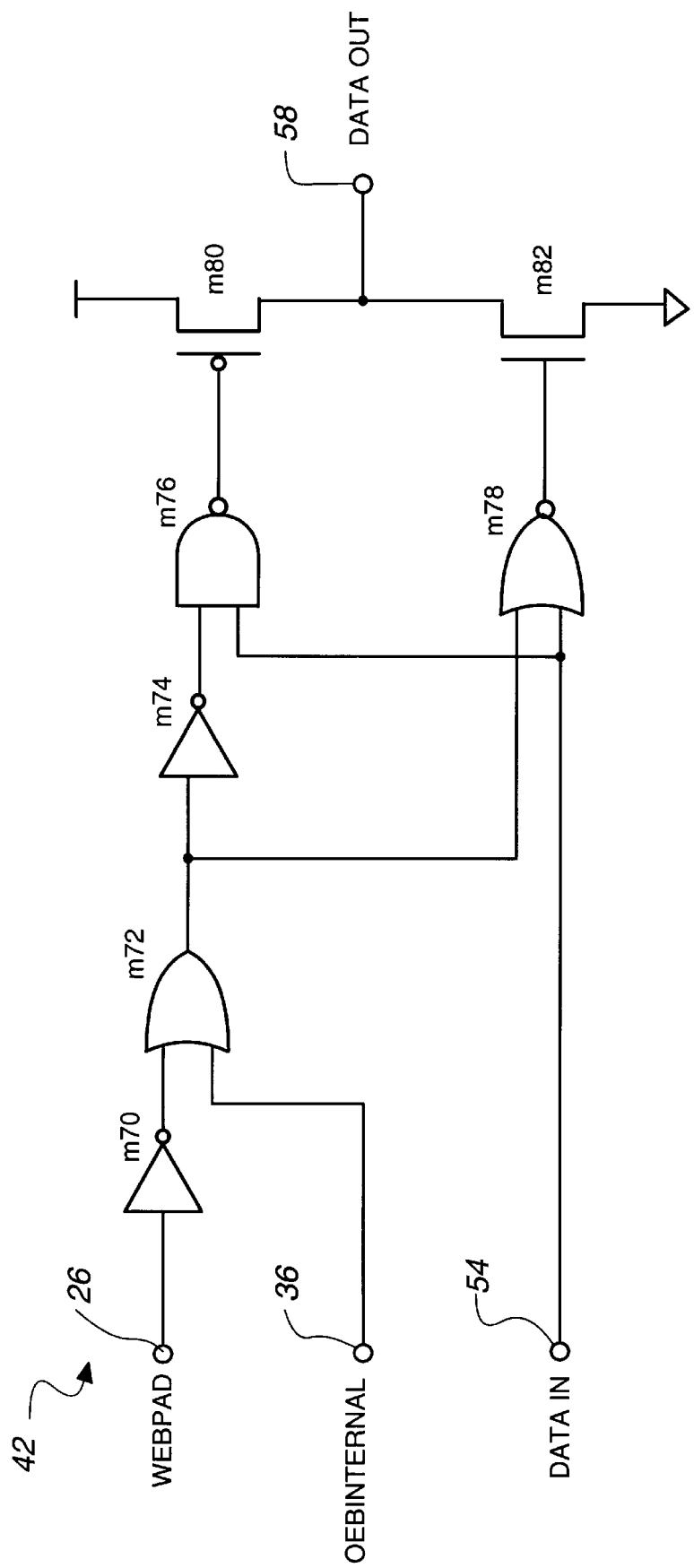
FIG. 9 is a schematic diagram of an output driver shown in the block diagram of FIG. 2.

The schematic diagram for the output driver circuit 42 is shown in FIG. 9. Output driver circuit 42 includes a WEBPAD input 26, an OEBINTERNAL input 36, a DATA IN input 54, and a DATA OUT output 58. Logic circuitry including inverter m70, OR gate m72, inverter m74, NAND gate m76, and NOR gate m78 are used to combine the WEBPAD, OEBINTERNAL, and DATA IN signals to control gates of driver transistors m80 and m82. Transistor m80 is a P-channel MOS device, and transistor m82 is an N-channel MOS device.

Figure 8:
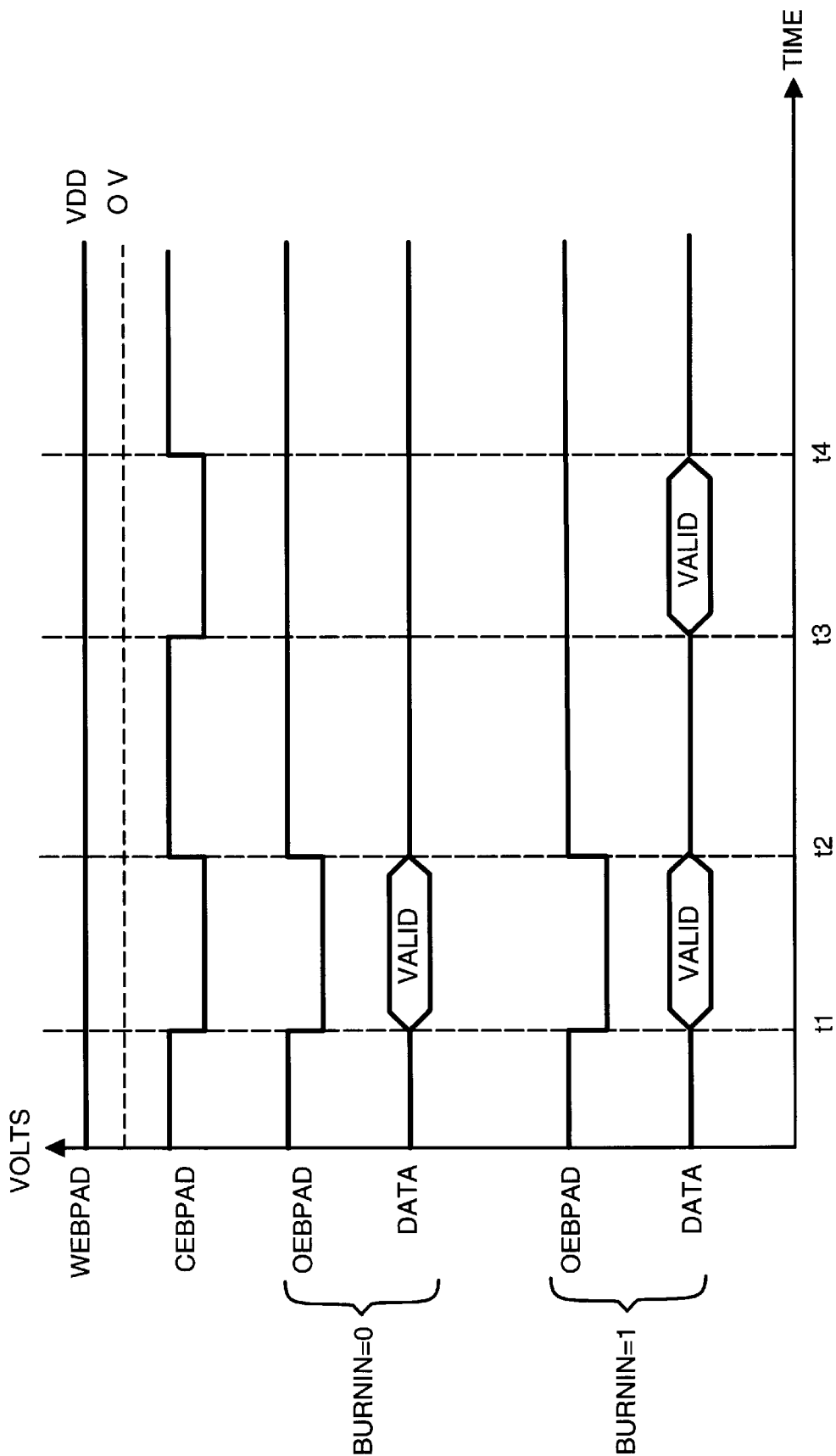

Turning now to FIG. 8, the timing diagram associated with output driver circuit 42 shows the status of the output impedance during normal operation (BURNIN=0) and during the special test mode (BURNIN=1). During normal operation, data is valid at the DATA OUT node 58 only when both the OEBPAD and CEBPAD signals are low. Otherwise, the DATA OUT node 58 is in a high impedance tri-state mode. During the special test mode, data is valid at the DATA OUT node 58 whenever the CEBPAD signal is low, regardless of the state of the OEBPAD signal. This assures that the data may be read for diagnostic purposes during the test mode. It especially indicates that the special burn-in test mode has been activated.

Figure 10:
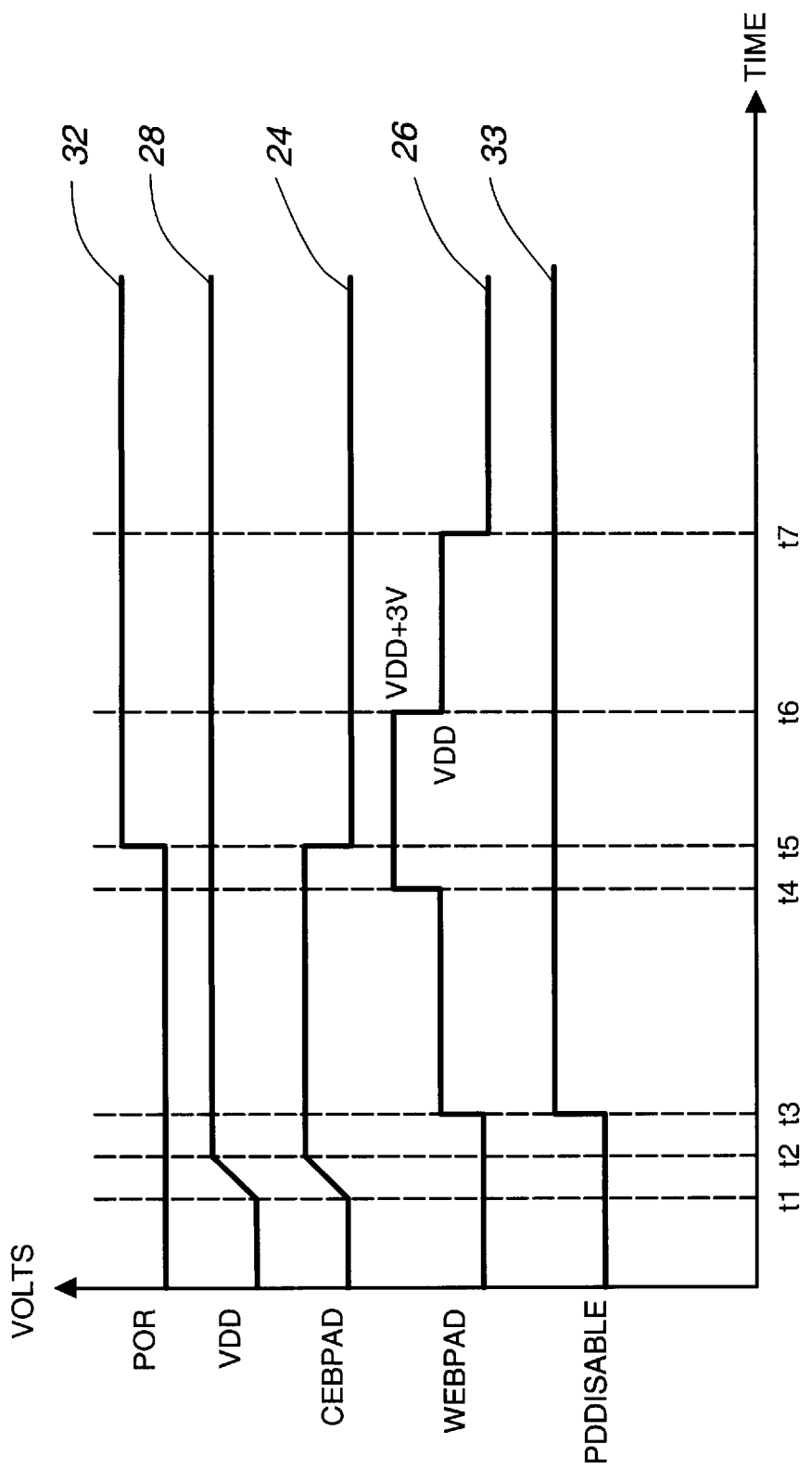
FIGS. 10–11 are timing diagrams associated with the second test mode circuit and the block diagram of FIG. 2.

Turning now to FIG. 10, a timing diagram pertaining to test mode circuit 46 is shown including the following voltage waveforms: the POR signal waveform 32; the VDD waveform 28; the CEBPAD waveform 24; the WEBPAD waveform 26; and the PDDISABLE waveform 33. The timing diagram of FIG. 10 illustrates a proper entry into the special test mode, whereby the WEBPAD signal is taken to the extra-high voltage level before the CEBPAD signal goes active low.

At time t1 all signal waveforms are at ground potential. At time t2, the VDD and CEBPAD signal waveforms have attained the full power supply voltage level. At time t3, the WEBPAD signal is energized. At time t4, the special test mode is entered by asserting the extra-high VDD+3 volts WEBPAD signal level, which in turn forces the PDDISABLE signal high. At time t5, the CEBPAD signal is taken low, which allows the POR signal to attain the full power supply voltage level. At time t6, the WEBPAD signal level is returned to the normal VDD power supply level, and at time t7, the WEBPAD signal level is returned to ground.

Again, it is important to note in FIG. 10 that once the special test mode has been entered into at time t4 the test mode is set, and cannot be reset until a power-down condition occurs. Thus, the status of the waveforms shown in FIG. 10, except for the status of the VDD waveform, has no effect on the logic level of the PDDISABLE signal waveform after time t6.

Figure 11:
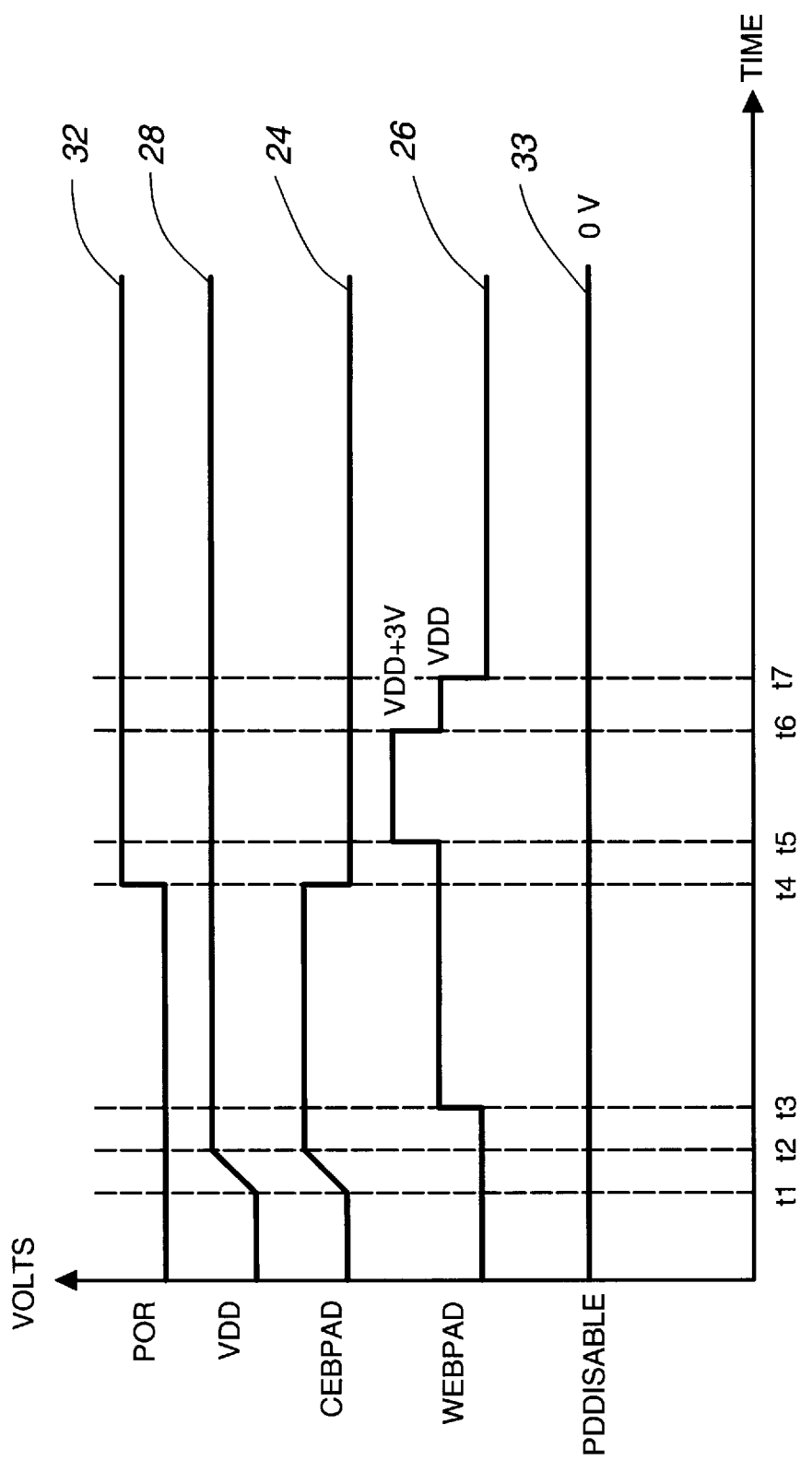

Turning now to FIG. 11, a timing diagram pertaining to test mode circuit 46 is shown that includes waveforms for the same signal nodes as in the timing diagram of FIG. 10. The timing diagram of FIG. 11, however, illustrates a failure to enter into the special test mode, because the WEBPAD signal is taken to the extra-high voltage level after the CEBPAD signal goes active low.

At time t1 all signal waveforms are at ground potential. At time t2, the VDD and CEBPAD signal waveforms have attained the full power supply voltage level. At time t3, the WEBPAD signal is energized. At time t4, the CEBPAD signal is taken low, which allows the POR signal to attain the full power supply voltage level. At time t5, the special test mode is attempted to be entered into by asserting the extra-high VDD+3 volts WEBPAD signal level. The PDDISABLE signal however, remains low and the special test mode is not initiated. At time t6, the WEBPAD signal level is returned to the normal VDD power supply level, and at time t7, the WEBPAD signal level is returned to ground.

Again, it is important to note in FIG. 11 that once the CEBPAD signal has been taken low, the special test mode cannot be entered until a power-down condition occurs. Thus, the status of any of the waveforms shown in FIG. 11, except for the VDD waveform, has any effect on the logic level of the PDDISABLE signal waveform after time t6.

Figure 12:
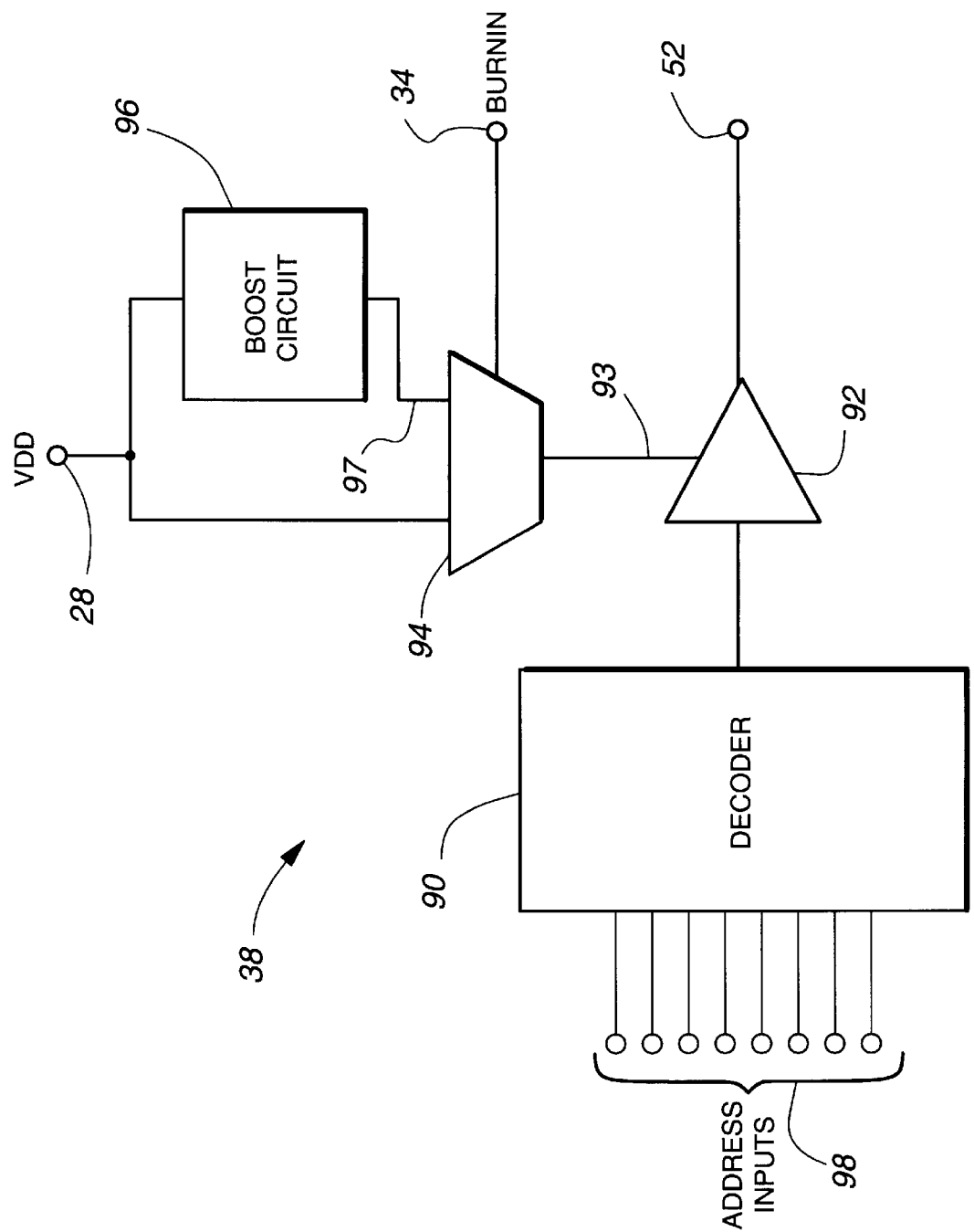
FIG. 12 is a schematic diagram of a row decoder shown in the block diagram of FIG. 2.

A schematic diagram is shown in FIG. 12 of row decoder 38. Row decoder 38 includes address inputs 98, a VDD node 28, a BURNS signal input 34, and an output node 52. The address inputs 98 are received by a standard decoder block 90 and the decoded output is received by buffer 92. The power supply for buffer 92 is received on line 93 from multiplexer 94. Multiplexer 94 is controller by the BURNIN signal at node 34. Multiplexer 94 either selects the normal VDD voltage on node 28, or the VDD voltage that has been boosted by boost circuit 96 on line 97. Thus, if BURNIN=1, the VDD power supply voltage on node 28 is passed to buffer 92 so that boosted voltages are not used.

A schematic diagram is shown in FIG. 13 of power detect circuit 48. Power detect circuit 48 includes a VDD node 28, a PDDISABLE input node 33, a CEBPAD input node 24, and a POR signal output node 32. Resistors 102 and 104 are used to sense the VDD voltage, producing a center-tap voltage at node 105. The sensing function of and current flow through resistors 102 and 104 is gated by transistor 106, which is in turn controlled by the PDDISABLE signal at node 33. The center-tap voltage at node 105 is received by Schmitt trigger circuit 108 to generate a logic PWREN signal. The PWREN signal is received by an inverter including transistors 110 and 112. The current flow through transistors 110 and 112 is gate by transistor 114, which is in turn controlled by the CEBPAD signal at node 24. The output of the inverter 110, 112 is received by a latch including cross-coupled inverters 116 and 118 to generate the CECTL signal. The CECTL signal is logically combined with the inverted CEBPAD signal through inverter 120 and AND gate 112 to generate the POR signal at node 32.

In sum, an operating method for a test circuit has been described that includes the steps of detecting a high voltage input using a high voltage detector circuit, providing a test mode signal in a test operational mode, and disabling the high voltage detector circuit such that substantially all of the active current flow is eliminated in a normal operational mode. The test operational mode is prevented from reverting to the normal operational mode until a power-down condition occurs.

Having described and illustrated the principles of the invention in a preferred embodiment thereof, it is appreciated by those having skill in the art that the invention can be modified in arrangement and detail without departing from such principles. For example, although test circuits 44 and 46 are shown and described in the context of a specific application, they can be used in any other application in which a special test or control mode is required, particularly for low power applications. We therefore claim all modifications and variation coming within the spirit and scope of the following claims.

We claim:

1. A test mode circuit comprising:
    a high voltage detector having an input for receiving a high voltage signal and an output;
    a Schmitt trigger having an input coupled to the output of the high voltage detector and an output;
    a latch having an input coupled to the output of the Schmitt trigger and an output for providing a test mode signal in a test operational mode; and
    means for disabling the high voltage detector and Schmitt trigger such that substantially all active current flow associated with the high voltage detector and Schmitt trigger is eliminated in a normal operation mode.

2. A test mode circuit as in claim 1 further comprising means for preventing a reset condition in the latch during the test mode until a power-down condition occurs.

3. A test mode circuit as in claim 1 further comprising a glitch filter interposed between the output of the Schmitt trigger and the input to the latch.

4. A test mode circuit as in claim 1 in which the input to the high voltage detector comprises an integrated circuit pin coupled to both the test mode circuit and to other circuitry not forming part of the test mode circuit.

5. A test mode circuit comprising:
    a high voltage detector having an input for receiving a high voltage signal, a control node, and an output;
    a Schmitt trigger having an input coupled to the output of the high voltage detector, a control node, and an output;
    a latch having an input coupled to the output of the Schmitt trigger and an output for providing a test mode signal; and
    a control circuit having an input for receiving a control signal, and an output coupled to the control nodes of the high voltage detector and Schmitt trigger.

6. A test mode circuit as in claim 5 in which the high voltage detector comprises:
    a first diode having an anode forming the input and a cathode;
    a second diode having an anode coupled to the cathode of the first diode and an anode forming the output;
    a first transistor having a drain coupled to the output, a gate coupled to a source of power supply voltage, and a source; and
    a second transistor having a drain coupled to the source of the first transistor, a gate forming the control node, and a source coupled to ground.

7. A test mode circuit as in claim 6 in which the first and second diodes each comprise diode-connected N-channel transistors, and the first and second transistors each comprise N-channel transistors.

8. A test mode circuit as in claim 5 further comprising a diode having a cathode coupled to the input of the high voltage detector and an anode coupled to ground.

9. A test mode circuit as in claim 8 in which the diode comprises a diode-connected N-channel transistor.

10. A test mode circuit as in claim 5 further comprising a capacitor coupled between the output of the high voltage detector and ground.

11. A test mode circuit as in claim 10 in which the capacitor comprises a capacitor-connected N-channel transistor.

12. A test mode circuit as in claim 5 further comprising a capacitor coupled between the output of the Schmitt trigger and a source of supply voltage.

13. A test mode circuit as in claim 12 in which the capacitor comprises a capacitor-connected P-channel transistor.

14. A test mode circuit as in claim 5 further comprising a glitch filter interposed between the output of the Schmitt trigger and the input to the latch.

15. A test mode circuit as in claim 14 in which the glitch filter comprises:

a logic gate having first and second inputs and an outputs, one of the inputs being coupled to the output of the Schmitt trigger and the output being coupled to the input of the latch; and a plurality of inverters serially coupled between the first and second inputs of the logic gate.

16. A test mode circuit as in claim 5 in which the control circuit comprises an inverter.

17. A test mode circuit as in claim 5 in which the latch comprises:

an input stage having an input forming the input of the latch, a control node coupled to the output of the control circuit, and an output; and a latch stage having an input coupled to the output of the input stage, and an output forming the output of the latch.

18. A test mode circuit as in claim 17 further comprising means for setting the initial conditions at the input and output of the latch.

19. A test mode circuit as in claim 5 further comprising means for preventing a reset condition in the latch during the test mode until a power-down condition occurs.

* * * * *